Figure 1:
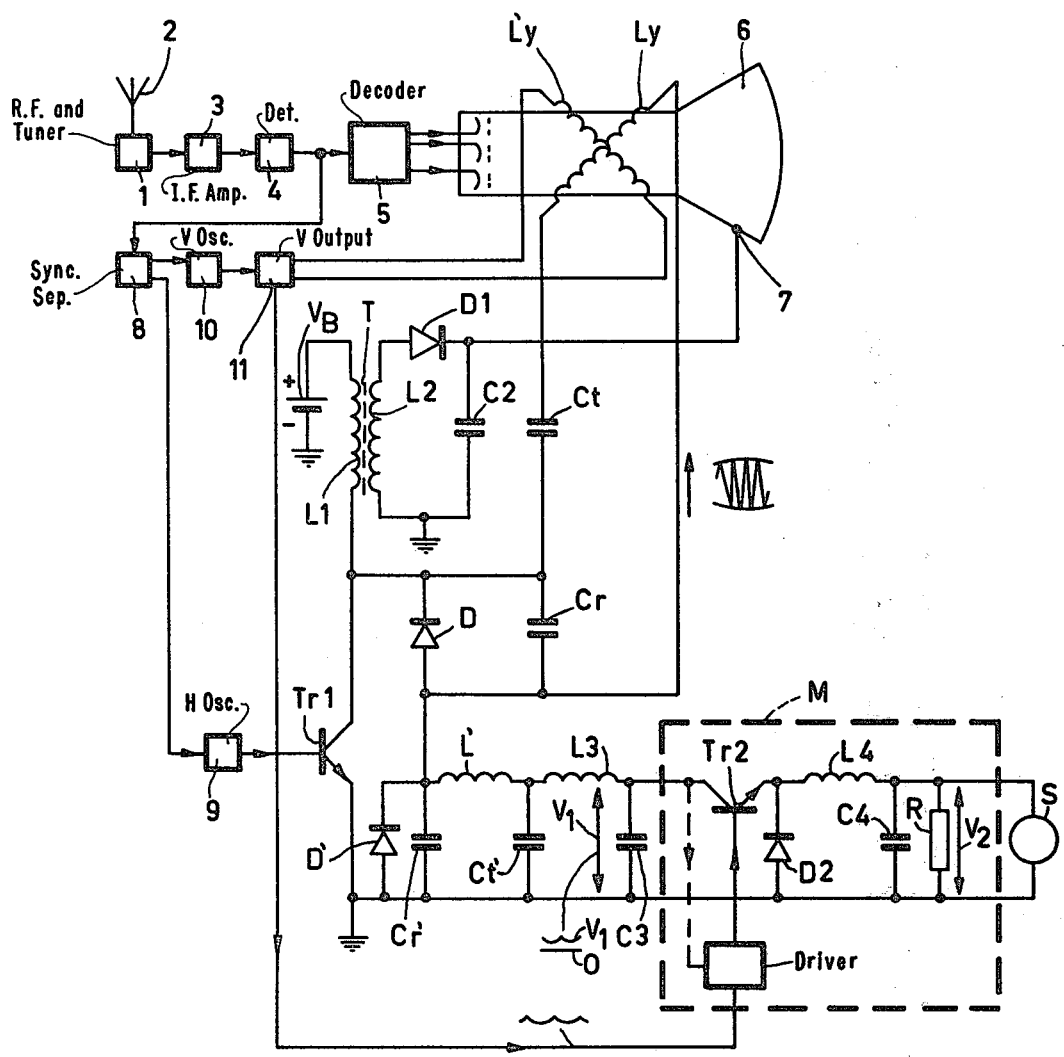

United States Patent [19]

Terry

[11] 4,140,949
[45] Feb. 20, 1979

[54] LINE SAWTOOTH DEFLECTION CURRENT GENERATOR

[75] Inventor: Alan J. Terry, London, England

[73] Assignee: U.S. Philips Corporation, New York, N.Y.

[21] Appl. No.: 754,968

[22] Filed: Dec. 27, 1976

[30] Foreign Application Priority Data

Jan. 16, 1976 [GB] United Kingdom ................. 1719/76

[51] Int. Cl.² ............................................ H01J 29/56
[52] U.S. Cl. .................................... 315/371; 315/411
[58] Field of Search ........................ 315/370, 371, 411

[56] References Cited

U.S. PATENT DOCUMENTS

| 3,444,426 | 5/1969 | Buechel | 315/371 |
|---|---|---|---|
| 3,825,793 | 7/1974 | Dietz | 315/371 |
| 3,906,305 | 9/1975 | Millsen et al. | 315/407 |
| 4,006,385 | 1/1977 | Onodera | 315/370 |

FOREIGN PATENT DOCUMENTS 525680 9/1940 United Kingdom ..................... 315/371

Primary Examiner—S. C. Buczinski
Attorney, Agent, or Firm—Frank R. Trifari; Henry I. Steckler

[57] ABSTRACT

A line sawtooth deflection current generator with modulating means for the purpose of correcting the amplitude variations of the current produced, the said modulating means including a stage operating in the switching mode.

20 Claims, 2 Drawing Figures

LINE SAWTOOTH DEFLECTION CURRENT GENERATOR

The invention relates to a circuit arrangement for generator a line sawtooth deflection current comprising switching means for periodically applying a voltage to a line deflection coil circuit and modulating means connected to the deflection coil circuit for changing the magnitude of the line deflection current.

Such a circuit arrangement is described in U.S. Pat. No. 3,906,305. For the purpose of correcting distortion in the horizontal direction of the image displayed in television display apparatus the line deflection current is modulated at field frequency, the field frequency variation being parabola-shaped over each field scan period. This modulation is known as East-West-modulation and can be used to correct for pin-cushion distortion in the displayed image in the East-West direction. The modulator and the line deflection circuit are coupled with one another in such a way that the deflection current actually undergoes the modulation referred to but also in such a way that the pulses occurring in a line output transformer during the line flyback period of the deflection current are not influenced. Direct voltages obtained by rectification of the said pulses, for example the extra high tension (E.H.T.) for the final anode of the image display tube, are therefore not modulated at field frequency.

In the above-mentioned patent a modulation source is connected to modulating terminals, which source behaves like a field frequency varying load on the voltage which otherwise would be present at these terminals, in which load energy has to be dissipated. This energy must be delivered by a supply source and causes heat. Furthermore, the network at the modulating terminals has an internal impedance which forms together with the modulation source a field frequency varying voltage divider. This has the drawback that this internal impedance is not constant but may vary, for example due to variations of the beam current in the image display tube which is a load on the extra high tension, which variations depend among others on the composition of the displayed picture.

It is therefore an object of the invention to provide an arrangement in which energy can be saved. It is another object of the invention to provide an arrangement in which the energy normally dissipated can be used to energise another circuit. It is still another object of the invention to provide an arrangement whereby the voltage at the modulating terminals does not vary with variations in the said internal impedance.

The invention provides a circuit arrangement for generating a line sawtooth deflection current through a line deflection coil, said arrangement comprising switching means operated at line frequency for periodically applying a voltage to a line deflection coil circuit for the production of the deflection current, modulating means connected to the deflection coil circuit and capable of modulating the magnitude of the voltage across the deflection coil during the line scan period thereby modulating the magnitude of the line deflection current including a stage operating in the switching mode at whose input the desired modulation is produced and whose output is connected to a load.

From a further aspect the invention also provides a circuit arrangement for generating a sawtooth deflection current through a line deflection coil comprising switching means for periodically applying a voltage to the deflection coil and modulating terminals for the modulation of the voltage thereby varying the amplitude of the deflection current, the modulating terminals being connected to the supply input terminals of a stage operating in the switching mode whose output terminals are coupled to a load.

The invention provides also a circuit arrangement for generating a line sawtooth deflection current through a line deflection coil, said arrangement comprising switching means operated at line frequency for periodically applying a voltage to a line deflection coil circuit for the production of said deflection current, modulating means connected to said deflection coil circuit and capable of modulating the magnitude of the voltage across said deflection coil during the line scan period thereby modulating the magnitude of said line deflection current including a stage operating in the switching mode.

The switched-mode stage may include a switching device and means for applying thereto controlling periodic pulses, which may be at line frequency, for alternately driving the switching device into a conducting state and a non-conducting state, and means for adjusting the duration of the controlling pulses depending on the nature and the magnitude of the modulation required at the supply input of the switched mode stage. With such an arrangement little power is dissipated in the switching device as the action of the switched-mode stage is to pass the power to the load. A comparator may be employed for comparing a waveform at the controlling pulse frequency with a signal of the form required to give the desired modulation of the deflection current.

The load may have a voltage thereacross having a predetermined value, which may be substantially constant, and this might be achieved by connecting the load to a constant reference voltage diode.

The load may be connected to a voltage source which defines the voltage across the load whilst this voltage source may comprise a rectifying circuit connected to a winding on a transformer connected to the switching means.

The switched-mode stage may include a choke for integrating the switching current, this choke may also serve to isolate the line deflection circuit from the switched-mode stage.

The load may be formed by a circuit at least part of whose power supply requirements are provided by the switched mode stage.

The stage operating in the switching mode may be a switched-mode power supply whose input provides the modulating voltage whilst the output produces a voltage across the load, which load voltage may be substantially constant. The switched mode power supply may include a transistor, means for applying to the base of the transistor a train of width modulated pulses the nature of the modulation being chosen such as to modulate the voltage present at the supply input in a required manner. The train of width modulated pulses may be derived from a comparator which compares a waveform at the frequency of the modulated pulse train, which may be the line frequency, with a signal of the form required to give the required modulation. The waveform at the frequency of the modulated pulse train may be compared with a parabolic signal at field frequency, the voltage being modulated such that the magnitude of the line deflection current is changed over a field period in such a manner as to provide correction for pin-cushion distortion in the East-West direction on a television display tube associated with the line deflection coil. The switched mode power supply may be of the forward type in which case the comparator may make an additional comparison with the voltage at the supply input.

The invention additionally provides television display including a circuit arrangement of the type above described.

Figure 2:
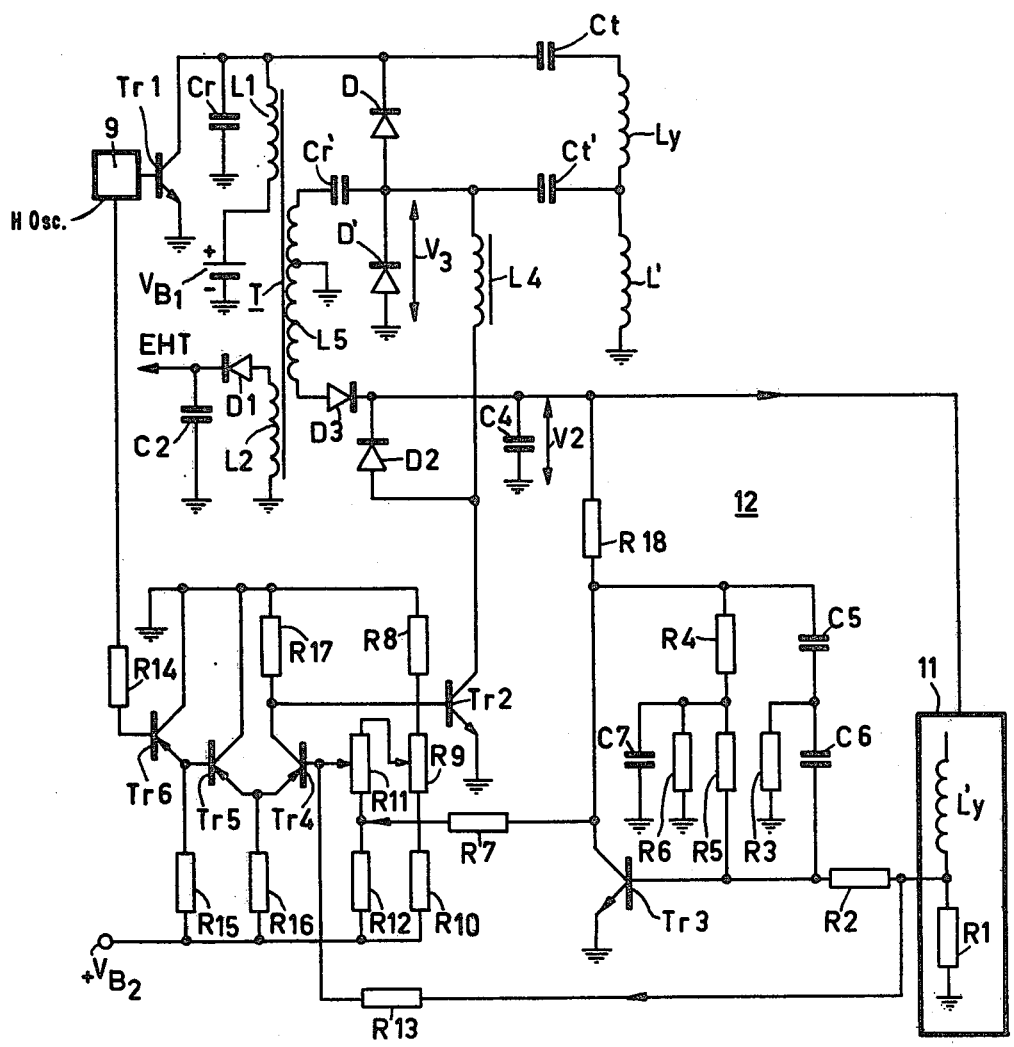

The above and other features of the invention will be more readily understood by a perusal of the following description having reference to the accompanying drawings which show two embodiments of the invention by way of example to the drawings:

FIG. 1 is a diagrammatic representation of a television receiver showing a first embodiment of a circuit arrangement according to the invention, and FIG. 2 shows a second embodiment of the circuit arrangement.

The television receiver of FIG. 1 has an RF tuning unit 1 for connection to an aerial 2, an IF amplifier 3, a detector 4 and a video amplifier/colour decoder 5 which applies colour signals to a colour display tube 6. This tube has a final acceleration anode 7 and is provided with a first deflection coil Ly for horizontal (line frequency) deflection and a second deflection coil L'y for vertical (field frequency) deflection.

Line synchronizing pulses which are applied to a line oscillator and driver 9 are separated with the aid of a sync separator 8 from the output signal of detector 4, whilst separated field synchronizing pulses are applied to a field oscillator and driver 10. Oscillator and driver 10 controls a field output stage 11 which supplies the field deflection current for coil L'y. The line oscillator and driver 9 applies line switching pulses to control the operation of a line deflection output stage which provides the line deflection current for the coil Ly. The line output stage includes a line output transistor Tr1 whose base is driven by the line switching pulses from the line oscillator and driver 9 in known manner. A trace (scan) capacitor Ct is arranged in series with the line deflection coil Ly, while a retrace (flyback) capacitor Cr and a diode D are connected in parallel with the series arrangement thus formed. These four elements together with transistor Tr1 acting as a switch, are the main components of the deflection section, other components not being important for an understanding of the invention being omitted for simplicity's sake.

The collector of transistor Tr1 is connected to one end of the primary winding L1 of a line output transformer T and is also connected to the junction of the circuit elements D, Cr and Ct. The end of the primary winding L1 remote from the collector is connected to the positive terminal of a D.C. supply $+V_B$ whose negative terminal as well as the emitter of transistor Tr1 is connected to ground.

The ends of the elements D, Cr and Ly not connected to capacitor Ct are connected to the junction of a diode D', a capacitor Cr' and a coil L'. A capacitor Ct' is arranged in series with coil L' while the ends of the elements D', Cr', and Ct' remote from coil L' are connected to ground. The conductivity direction of the diodes D and D' is such that they both conduct during the first half of the line scan period. Transistor Tr1 is, as shown, of the npn-type so that the deflection current flowing through coil Ly flows therethrough during the second half of the line scan period.

During the line flyback period the diodes D and D' and transistor Tr1 are all cut off. Pulses of high amplitude are produced across capacitors Cr and Cr'. The networks L1, Ly and Cr, as well as L', Cr', are each given the same resonant frequency, viz. a frequency whose period is approximately equal to twice the flyback period of the line deflection current. If the voltage $+V_B$ of the D.C. supply is constant or maintained constant in a known way, then the pulses occurring at the junction of the collector of transistor Tr1 and the network constituted by the elements D, Cr, Ly and Ct will be of constant amplitude. This also applies for the pulses present across primary winding L1 and across secondary windings of the transformer T. FIG. 1 shows one of these windings, L2, the pulses appearing thereacross being rectified by means of a rectifier D1 and a direct voltage is thus generated across a capacitor C2, which voltage is constant and supplies the required E.H.T to the final anode 7 of the colour display tube 6. Other secondary windings may be provided to supply other voltages for use in the television receiver.

To the junction of coil L' and capacitor Ct' is connected a further coil L3, the end of this coil remote from L' and Ct' being connected through a capacitor C3 to ground. A modulating load M is arranged in parallel with capacitor C3, for the purpose of varying the voltage $V_1$ thereacross so varying the voltage across capacitor Ct' as coil L3 acts to prevent line frequency pulses appearing at the modulating load M and appears as a virtual short circuit at substantially lower frequencies, C3 acting as a smoothing capacitor for these pulses. This effectively varies the scan voltage across capacitor Ct and hence the amplitude of the deflection current. The introduced variation is such that the magnitude of this voltage is modulated at the field frequency in a parabolic manner during the field scan period such that the trough of the parabola occurs in the middle of each field scan period which coincides with minimum magnitude of $v_1$. Such parabolic field frequency modulation is employed to correct for displayed pincushion distortion in the East-West direction. However, with such an arrangement the various direct voltages obtained from line frequency pulses occurring across secondary windings of transformer T are not influenced by the parabolic field frequency variation of voltage $v_1$.

In the absence of modulating load M voltage $v_1$ would remain constant with a value dependent at first approximation on the impedances presented by the networks D, Cr, Ly, Ct and D', Cr', L', Ct'. In a practical example with $+V_B = 150$ V, it was arranged that the voltage across capacitor Ct for the above condition had a value 3 times larger than that of the voltage across capacitor Ct', so that voltage $v_1$ had a value of approximately 38 V. With a modulating load of some kind present in parallel with capacitor C3 which at field frequency is effectively in parallel with Ct', voltage $v_1$ will vary because the network which capacitor Ct' sees has a source impedance determined by the components of the network and the mode of circuit operation. In the above-mentioned United States Patent the modulating load behaves like a field frequency varying load which forms together with the previously mentioned source impedance a field frequency varying voltage divider. Voltage $v_1$ varies for example from a value of 38 V at the beginning of each field scan period to a much lower voltage in the middle of scan period and attains 38 V again at the end of each field scan period, a current originating from the junction of coil L' and capacitor Ct' flowing into the load.

In the present invention the modulating load M is formed by a stage operating in the switching-mode and having the configuration of a switched-mode power supply. The stage works in such a way that voltage $v_1$ varies in the desired way without being influenced by variations of the source impedance considered above. In fact, this impedance is not constant but varies among other causes due to variations of the beam current in the display tube, which current acts as a load on the E.H.T supply circuit and depends inter alia on the composition of the displayed picture. If $v_1$ were influenced by changes in the source impedance these would result in geometric distortion of the displayed picture depending on its composition and could be obviated by changing the energy dissipation through the load which would mean an opposite change of the resistance value of the load. This can be avoided by using a switched-mode power supply stage as explained hereinafter, and has the advantage that the energy dissipated in previous arrangements in the load is transferred to the output of the switched mode stage at a place where it can usefully be used or can be conveniently dissipated, the losses of the switched mode stage being very low.

The switched-mode stage shown in FIG. 1 has the configuration of a switched mode power supply of the forward type. A npn-transistor Tr2 has its collector connected to the junction of coil L3 and capacitor C3 and its emitter connected to the cathode of a diode D2 whose anode is grounded, the emitter being also connected to one end of a coil L4 whose other end is connected to a capacitor C4 and a resistive component R. The ends of capacitor C4 and resistance R remote from coil L4 are connected to ground. Transistor Tr2 receives periodic switching pulses on its base which alternatively drive this transistor into conduction and cut off. When transistor Tr2 is conducting voltage from the capacitor C3 is applied through the transistor and coil L4 to the resistance R, some energy being stored in coil L4. During the cut off periods diode D2 conducts and energy stored in coil L4 is transferred to the resistance R. A triangular shaped current flows continuously through coil L4 from left to right in FIG. 1 at switching frequency. An output voltage $V_2$ is then present across resistance R which thus constitutes the load for the switched-mode stage considered.

The base drive switching signal for transistor Tr2 is supplied by a driver stage Dr containing an oscillator which generates a triangular waveform at the switching frequency and a comparator in which a parabolic field frequency reference signal originating from the field output stage 11 is compared with the triangular waveform. The comparator produces an output switching signal for the transistor Tr2 in the form of a pulse train of the same frequency as the triangular waveform but in which the mark-space ratio of the pulse train is dependent on the instantaneous magnitude of the parabolic field frequency reference signal. The pulse train applied to the base of transistor Tr2 varies its periods of conduction in normal switching mode technique. Instead of providing an oscillator in the driver stage Dr the triangular waveform when at line frequency could be derived from line frequency signals appearing elsewhere, for example from the line oscillator 9. Where the driver stage Dr incorporates a free-running oscillator this may be synchronized by line frequency signals. The use of the line frequency as the switching rate for transistor Tr2 avoids beat frequency problems and reduces the problem of radio frequency interference radiation.

If $\delta$ is the ratio of the conduction time of transistor Tr2 to a whole period of its driving pulse train, there is a known relation between voltages $v_1$ and $v_2$ and ratio $\delta$. In the case of a forward switched-mode stage the relation is $v_2 = \delta \cdot v_1$. In known arrangements, voltage $v_2$ can have a given function with time independent of variations of voltage $v_1$, which is achieved by a controlled adjusting of ratio $\delta$. For example, voltage $v_2$ can be maintained constant while voltage $v_1$ varies in some way. In the arrangement of FIG. 1, however, the ratio $\delta$ is varied such that voltage $v_1$ varies in a predetermined way with the purpose of correcting for East-West pin-cushion distortion while most of the energy originating from the terminals at which voltage $v_1$ is present is dissipated in load resistance R.

In FIG. 1 it is possible to impress the voltage from a voltage source S across the load resistance R. Voltage $v_2$ is consequently determined by the voltage of source S. From the relation given above, it follows that voltage $v_1$ can be given any desired variation provided ratio $\delta$ varies in an appropriate way. In the present case, ratio $\delta$ may be varied by means of the comparator included in driver circuit Dr such that voltage $v_1$ has a desired form independent of a change in voltage $v_2$. The source S may be a rectifying circuit rectifying a voltage originating through a transformer from the electrical mains and whose voltage follows the fluctuation of the mains. Alternatively the source S may be formed by a rectifying circuit connected to a secondary winding on transformer T in which case there would be some variation in the voltage produced with variation in the beam current in the display tube 6. In either case the voltage of the source S may be kept constant by means of a zener diode for example. Because of the relation given above, voltage $v_2$ will always be lower than voltage $v_1$.

It will be appreciated that the terminals connected to capacitor C3 are really the input terminals of the switched mode power supply whilst the terminals between which voltage $v_2$ is present are really the output terminals of this supply, since power is supplied from the deflection circuit to the input terminals and is subsequently supplied, theoretically without loss, to the load resistance R. It will also be appreciated that this load may be replaced by one or more circuits of the television receiver which circuits will then receive at least some of their power from the switched mode power supply in FIG. 1. The load R may also be replaced by a load of larger resistive value or may even be dispensed with in the case where source S is a lossy source and itself forms the load with energy returned back to source S. The energy referred to originates from the switched-mode power supply stage and hence from the deflection circuit. A condition that has to be met is that all the energy transferred through the switched-mode stage is consumed at the output terminals. However, the energy transferred in the arrangement described can at least be used in contradistinction with the former case.

As described so far the expression $v_2 = \delta v_1$ gives rise to nonlinear circuit operation so that even with $v_2$ constant, changes in the mark-space ratio of the drive for transistor Tr2 will not produce a linear variation of $v_1$. In order to provide a more linear relationship between the mark-space ratio and $v_1$ a feedback component may be applied from the collector of transistor Tr2 to the driver stage Dr as shown by the broken line to further control the mark-space ratio of the switching pulses.

Modulating load M may be constituted in principle by any form of switched-mode power supply. In the same way other forms of an East-West modulator circuit may be used without the principle of the invention being altered. Another diode modulator is described, for example, in Philips Application Note 206: "20AX for 110° Colour Television, Deflection and power supply circuits" with reference to FIG. 5.

In the above description coil L3 and capacitor C3 are included to provide better filtering action for components at line frequency. In practice, in some applications Ct' can be made large enough to give sufficient filtering of line frequency components and L3 and C3 may be omitted from the circuit.

A further embodiment of the invention using a modified form of the diode modulator circuit is shown in FIG. 2, the switched-mode power supply stage in this Figure being of the up-converter type. Circuit elements having similar functions to that in FIG. 1 are given the same reference symbols. Most of the circuit blocks in the television receiver not required for an understanding of the invention have been omitted.

A sawtooth voltage at field frequency present across a feedback sensing resistor R1 connected in series with the field deflection coil L'y is applied through a resistor R2 to a Miller integrator 12. The desired field frequency parabolic waveform is available at the collector of a transistor Tr3 which is part of the integrator 12. Two capacitors C5 and C6 are serially connected between the collector and base of transistor Tr3, a resistor R3 being connected between the junction of these capacitors and ground. Two resistors R4 and R5 are also connected between the collector and base of transistor Tr3 with a capacitor C7 connected between the resistors junction and ground. The resistors R4 and R5 provide the bias for the base of transistor Tr3, a resistor R6 connected in parallel with capacitor C7 assisting this bias. The resistor R3 is included in the integrator circuit to produce a slight phase shift to compensate for imperfect integration so as to keep the parabola symmetrical. Resistors R4 and R5 and capacitor C7 give the parabola an additional shaping, viz. a reduced slope near the extremities, which is very near to the shape required in practice with the type of colour display tube employed.

The parabola is obtained from the junction of the collector of transistor Tr3 and a resistor R18 (whose other end derives a supply from the output of the switched-mode stage), this parabola being applied through a resistor R7 to the base of a pnp transistor Tr4 forming together with a pnp transistor Tr5 the comparator for the switched mode stage. A potential divider formed by resistors R8 and R10 and a potentiometer R9 is connected between ground and the positive terminal of a low voltage D.C. supply $+V_{B2}$, the wiper of potentiometer R9 being connected through a further potentiometer R11 and a resistor R12 to the supply $V_{B2}$. Resistor R7 conveying the field parabola is connected to the junction of R11 and R12, the wiper of potentiometer R11 being connected to the base of transistor Tr4. Potentiometer R11 provides a means for controlling the parabola amplitude by adjusting the A.C. amplitude applied to transistor Tr4 while potentiometer R9 provides a means for controlling the displayed width by adjusting the D.C.-bias for this transistor.

In addition to the field parabola obtained from the integrator 12, a field sawtooth ramp of small amplitude derived from resistor R1 is applied through a resistor R13 to the base of transistor Tr4 to tilt the parabola. This tilt is used to correct for trapezium distortion of the display of the colour display tube.

A triangular or sawtooth shaped wave train at line frequency originating from the line oscillator and driver 9 is applied through a resistor R14 and an emitter follower pnp transistor Tr6 to the base of transistor Tr5, the emitter base connection being connected through a resistor R15 to the supply $+V_{B2}$. Transistors Tr4 and Tr5 are emitter-coupled, the emitters being connected through a resistor R16 to the supply $+V_{B2}$. Transistor Tr5 is fully conducting during those portions of the voltage wave train applied to its base which pass a level determined by the parabola at the base of transistor Tr4 and is otherwise cut off. The triangular line frequency wave is thus converted into a train of line frequency pulses whose individual pulse duration depends on the instantaneous amplitude of the parabola which varies at field frequency. The width modulated line frequency pulse train thus obtained at the junction of the collector of transistor Tr4 with its load resistor R17 is fed to the base of the switching transistor Tr2.

The switched-mode power supply stage consists in FIG. 2 of transistor Tr2, coil L4 connected between a first input terminal of the power supply and the collector of this transistor, diode D2 connected between the said collector and a first supply output terminal and capacitor C4 connected between this output terminal and ground. The second input and output terminals of the power supply are both connected to ground. The first input terminal is connected to the junction of diodes D and D' on which line flyback pulses are present. The input voltage $v_3$ for the supply is therefore a line frequency pulse signal the tops of the flyback pulses of which have a parabolic envelope at field frequency, the value of the signal voltage during the line scan periods being zero. It is to be noted that coil L4 not only integrates the switching mode current but also serves to isolate the modulated line pulses from the switching circuit.

The voltage source S whose voltage is impressed on the output of the switched-mode power supply is constituted by a rectifying circuit of line pulses. Such pulses are present at one end of a secondary winding L5 of the line output transformer T whose other end is connected to ground and are rectified during line scan periods by means of a diode D3 whose cathode is connected to the above-mentioned first output terminal of the switched-mode power supply stage. Since the output voltage of an up-converter is always equal to or higher than its input voltage, voltage $v_2$ has a value at least equal to the amplitude of voltage $v_1$ where $v_1$ is the mean of the parabolic envelope at field frequency of voltage $v_3$ plus a possible component to provide a control over picture width i.e. approximately 38 V in the example quoted above. A value of 38 V therefore is particularly suitable, for example, for the supply voltage of the field output stage 11 of the receiver. The number of turns of winding L5 must be chosen such that the amplitude of the pulses thereacross correspond to a rectified voltage of about 38 V, i.e. approximately 350 V. If the main supply voltage $+V_{B1}$ is maintained constant, for example because it is generated by means of a stabilized thyristor power supply, then this amplitude and hence the rectified voltage will also remain substantially constant. The energy flowing from the line deflection circuit through coil L4, which energy is typically 2 to 4W depending on the picture width setting, is thus not lost but is recovered and used for feeding current into the field time base supply rail, thereby effectively improving the efficiency of the deflection part of the receiver. It will be noted in this respect that the switched-mode power supply stages introduces very few losses.

The comparator transistors Tr4 and Tr5 may be energized from the same supply voltage of about 12 V as line oscillator and driver 9 which may be obtained by rectifying line pulses on a further winding of transformer T. Provisions must then be made in known way for ensuring that the arrangement is energized at switch-on of the television receiver.

If voltage $v_2$ is constant then voltage $v_1$ is only a function of ratio $\delta$. The added complexity of comparing the shape of voltage $v_1$ with that of the reference signal originating from the field time base, as considered with FIG. 1, is not now present. The appropriate shape will always be obtained by adapting the shape of this reference signal and/or the variation of ratio $\delta$ in order to obtain the desired variation of voltage $v_1$. This is further simplified in the case of an up-converter because of the relation $v_2 = v_1/1-\delta$ is valid in this case, which means that $v_1$ is a linear function of $v_2$ and of $\delta$. The appropriate shape will therefore be obtained for $v_1$ when the parabola has the correct shape the only condition being that the comparator carries out the analogue parabola to digital conversion in a linear manner, which is ensured by the linear character of the circuit chosen and the low operating frequency, provided of course that the line frequency triangular wave applied to transistor Tr6 is linear.

If however voltage $v_2$ is not constant but subject to variations, the amplitude of the triangular line frequency waveform applied to transistor Tr6 may be made to proportionally follow the variations, the resulting further modulation of the switching pulses for transistor Tr2 making $v_1$ independent of these variations.

Another advantage of the up-converter type of switched-mode stage is the fact that ratio $\delta$ can assume all values lying between 0 and 1, these extreme values being theoretically included, and hence the ratio of voltage $v_1$ to voltage $v_2$ can theoretically assume all values between 1 and 0. Ratio $\delta$ could thus vary from zero at the beginning of a field scan period to 1 in the middle of such a period and then to zero again at the end of the period, this variation being a quadratic function of time. The minimum possible value of voltage $v_1$ is therefore zero. The complete range of variation of ratio $\delta$ can thus be fully used. With other types of switched-mode stage ratio $\delta$ canot assume low values. With the forward converter of FIG. 1, for example, voltage $v_1$ is inversely proportional to ratio $\delta$, so that $\delta$ cannot be allowed to become too small.

Compared with modulating loads previously proposed which do not rely on switched-mode operation, the circuit of FIG. 2 is capable of reducing the energy consumption in the deflection circuits by typically 3W. Moreover, the losses caused by transistor Tr2 acting as a switch are much smaller than if it acted as a variable load so that a lower power rated device can be used. Such a device may be cheaper and need not be cooled by means of a heatsink. Since coil L4 is also necessary in the previously known circuit as a filter choke, the only additional components are diode D2 and the comparator. The new arrangement is therefore comparable in cost with the known arrangement while saving space due to the emission of the heatsink and lends itself of being produced in integrated circuit form.

As described so far correction for pin-cushion distortion in the East-West direction, current through the line deflection coil Ly is reduced about the beginning and end of a field scan period. The circuit may also operate with correction circuits which increase the current through the line deflection coil Ly about the centre of a field scan period. In such a case FIG. 1 could be modified to connect the common line for components D', Cr', Ct', D2, C4 and R to a negative supply rail, the voltage across capacitor C3 then being a negative going parabola below zero potential. Transistor Tr2 in such a case may either be connected in reverse or replaced by a pnp transistor.

The circuit is described for the correction of pin-cushion distortion in the East-West direction. It will be clear that it can also be used for other forms of correction, for example for stabilizing the amplitude of the deflection current against mains supply voltage fluctuations and E.H.T variations. These may be attained at the same time as obtaining pin-cushion correction.

What is claimed is:

1. A circuit for generating a line frequency sawtooth deflection current having trace and retrace periods through a deflection coil, said circuit comprising a first sawtooth network comprising a trace capacitor adapted to be coupled to said coil, and a retrace capacitor coupled to said trace capacitor, a second sawtooth network series coupled to said first network and comprising a diode, a second coil coupled to said diode, a second trace capacitor coupled to said second coil, and a second retrace capacitor coupled to said second trace capacitor, means coupled to said networks for receiving a supply voltage from a source, a controlled switch which is non-conducting during the retrace period, the series arrangement of said networks being coupled in parallel across the controlled switch, and a switching mode modulating means for varying the voltage across one of the trace capacitors for modulating the magnitude of the line sawtooth deflection current through said deflection coil.

2. A circuit as calimed in claim 1, wherein said switching mode means includes a supply input, a switching device, and means for applying thereto controlling periodic pulses for alternately driving said switching device into a conducting state and a non-conducting state and for adjusting the duration of the controlling pulses depending on the nature of the magnitude of the modulation required at the supply input of said switching mode means.

3. A circuit as claimed in claim 2, wherein the frequency of said controlling pulses comprises the line frequency.

4. A circuit as claimed in claim 2, wherein said applying and adjusting means comprises a comparator means for comparing a waveform at the controlling pulse frequency with a signal of the form required to give the desired modulation of said deflection current.

5. A circuit as claimed in claim 4, wherein said waveform at the controlling pulse frequency is compared with a parabolic signal at field frequency, said voltage at said one of said trace capacitors being modulated such that the magnitude of the line deflection current is changed over a field period to provide correction for pin-cushion distortion in the East-West direction on a television display tube associated with said line deflection coil.

6. A circuit as claimed in claim 4, wherein said switching mode means comprises a forward converter type, said comparator means including means for making an additional comparison with the voltage at the input of said switching mode means.

7. A circuit as claimed in claim 1, wherein said switching mode means comprises a power supply having an input coupled to said one trace capacitor and an output adapted to be coupled to a load, a voltage having a predetermined value being produced across said load due to the output of said switching mode means.

8. A circuit as claimed in claim 7, wherein said load voltage is substantially constant.

9. A circuit as claimed in claim 8, wherein said load includes a constant reference voltage diode.

10. A circuit as claimed in claim 7, further comprising a voltage source means coupled to said load for defining the voltage across said load.

11. A circuit as claimed in claim 10, further comprising a transformer having a winding coupled to said switching mode means, and wherein said voltage source comprises a rectifying circuit coupled to said winding.

12. A circuit as claimed in claim 1, wherein said switching mode means includes a choke means for integrating the switching current and for isolating the line deflection circuit from said switching mode means.

13. A circuit as claimed in claim 7, wherein said load comprises a circuit required power, at least part of the power requirements for said circuit being provided by said switching mode means.

14. A circuit for generating a line frequency sawtooth deflection current having trace and retrace periods through a deflection coil, said circuit comprising a first sawtooth network comprising a trace capacitor adapted to be coupled to said coil and a retrace capacitor coupled to said trace capacitor, a second sawtooth network series coupled to said first network and comprising a diode, a second coil coupled to said diode, a second trace capacitor coupled to said second coil and a second retrace capacitor coupled to said second trace capacitor, means coupled to said networks for receiving a supply voltage from a source, a controlled switch which is non-conducting during the retrace period, the series arrangement of said networks being coupled in parallel across the controlled switch, and a switching mode modulating means for varying the voltage across one of the trace capacitors for modulating the magnitude of the line sawtooth deflection current through said deflection coil, said modulating means having supply input terminals coupled to said one of said trace capacitors and supply output terminals adapted to be coupled to a load.

15. A circuit as claimed in claim 14, wherein said switching mode means includes a switching device, and means for applying thereto controlling periodic pulses for alternately driving said switching device into a conducting state and a non-conducting state and for adjusting the duration of the controlling pulses depending on the nature and the magnitude of the modulation required at the supply input terminals of said switching mode means.

16. A circuit as claimed in claim 15, wherein the frequency of said controlling pulses comprises the line frequency.

17. A circuit as claimed in claim 15, wherein said applying and adjusting means comprises a comparator means for comparing a waveform at the controlling pulse frequency with a signal of the form required to give the desired modulation of said deflection current.

18. A circuit as claimed in claim 17, wherein said waveform at the controlling pulse frequency is compared with a parabolic signal at field frequency, said voltage at said one of said trace capacitors being modulated such that the magnitude of the line deflection current is changed over a field period to provide correction for pin-cushion distortion in the East-West direction on a television display tube associated with said line deflection coil.

19. A circuit as claimed in claim 17, wherein said switching mode means comprises a forward converter type, said comparator means including means for making an additional comparison with the voltage at the input of said switching mode means.

20. A circuit as claimed in claim 14, wherein said switching mode means includes a choke means for integrating the switching current and for isolating the line deflection circuit from said switching mode means.

* * * * *